United States Patent [19]
Soda

[11] Patent Number: 5,956,378
[45] Date of Patent: Sep. 21, 1999

[54] PHASE LOCK BY A FREQUENCY AND PHASE DIFFERENCE BETWEEN INPUT AND VCO SIGNALS WITH A FREQUENCY RANGE ADJUSTED BY SYNCHRONISM BETWEEN THE INPUT AND THE VCO SIGNALS

[75] Inventor: Masaaki Soda, Tokyo, Japan

[73] Assignee: NEC Corporation, Tokyo, Japan

[21] Appl. No.: 08/812,245

[22] Filed: Mar. 6, 1997

[30] Foreign Application Priority Data

Mar. 8, 1996 [JP] Japan ................................. 8-080793

[51] Int. Cl.[6] ........................................................ H03D 3/24
[52] U.S. Cl. .......................... 375/376; 375/374; 327/157
[58] Field of Search ........................................ 375/316, 340, 375/346, 354, 371, 373, 374, 375, 376; 327/156, 157, 160; 331/25, 177 R, 172; 455/260, 265; 370/503, 516

[56] References Cited

U.S. PATENT DOCUMENTS

| | | | |
|---|---|---|---|
| 4,929,918 | 5/1990 | Chung et al. .............................. | 331/10 |
| 4,933,959 | 6/1990 | Knechtel ................................... | 375/376 |
| 5,075,640 | 12/1991 | Miyazawa ................................. | 331/10 |
| 5,172,397 | 12/1992 | Llewellyn ................................. | 375/359 |
| 5,375,148 | 12/1994 | Parker et al. ............................. | 375/376 |
| 5,414,390 | 5/1995 | Kovacs et al. ............................ | 331/2 |
| 5,452,325 | 9/1995 | Brown et al. ............................. | 375/376 |
| 5,513,225 | 4/1996 | Kelkar et al. ............................. | 375/376 |
| 5,646,968 | 7/1997 | Kovacs et al. ............................ | 375/376 |
| 5,659,588 | 8/1997 | Fiedler ...................................... | 375/376 |
| 5,761,258 | 6/1998 | Lee ............................................ | 375/376 |
| 5,809,095 | 9/1998 | Nakao ....................................... | 375/376 |
| 5,872,487 | 2/1999 | Adachi et al. ............................. | 375/376 |

FOREIGN PATENT DOCUMENTS 44 15 169  11/1995  Germany .

OTHER PUBLICATIONS

Marc A. Rich, "Designing Phase-Locked Oscillators for Synchronization", *IEEE Transactions on Communications*, vol. COM–22, No. 7, Jul. 1974, pp. 890–896.

*Primary Examiner*—Chi H. Pham
*Assistant Examiner*—Bryan Webster
*Attorney, Agent, or Firm*—Sughrue, Mion, Zinn, Macpeak & Seas, PLLC

[57] ABSTRACT

Besides a frequency-phase comparator for input and VCO signals, a filter for a frequency-phase difference signal, and a VCO controlled by a filter output signal to produce a phase locked VCO signal, a PLL circuit comprises a VCO controller for controlling an oscillation frequency range of the VCO when the input and the VCO signals are continuously in collapse of synchronism longer than a predetermined time interval, such as a pull-in time of the PLL circuit, with the collapse detected by the comparator. Preferably, the VCO comprises an inverter loop, each inverter delay controlled by the filter output signal and a loop length controlled by a VCO control signal. The VCO controller comprises an up-down counter for counting up or down a count signal decoded into the VCO control signal with the count counted up and down depending on whether the frequency-phase difference signal indicates, when the predetermined time interval is measured by a timer started upon occurrence of a collapse, that the VCO signal is higher or lower in frequency than the input signal.

18 Claims, 5 Drawing Sheets

PHASE LOCK BY A FREQUENCY AND PHASE DIFFERENCE BETWEEN INPUT AND VCO SIGNALS WITH A FREQUENCY RANGE ADJUSTED BY SYNCHRONISM BETWEEN THE INPUT AND THE VCO SIGNALS

BACKGROUND OF THE INVENTION

This invention relates to phase lock of an output signal to an input signal and, more particularly, to a phase locking method and to a phase locking loop (PLL) circuit. In particular, the phase locking method is useful in an IC circuit. The phase locking loop circuit is convenient for implementation as an IC circuit.

In general, various phase locking loop circuits are known. An example is described in a tutorial paper contributed by Marc A. Rich to the IEEE Transactions on Communications, Volume COM-22, No. 7 (July 1974), pages 890 to 896, under the title of "Designing Phase-Locked Oscillators for Synchronization".

In the manner which will later be described in greater detail, a conventional phase locking loop IC circuit comprises a frequency and phase comparator responsive to circuit input and output signals for producing a frequency and phase difference signal representative of a frequency and phase difference between the circuit input and output signals. Connected to the frequency and phase comparator, a filter filters the frequency and phase difference signal into a filtered signal having a voltage dependent on the frequency and phase difference. Controlled by the filtered signal, a voltage controlled oscillator (VCO) generates a voltage controlled oscillation (VCO) signal which is phase locked for use as the circuit output signal to the circuit input signal and which has an oscillation frequency decided by the voltage of the filtered signal in an oscillation frequency range of the voltage controlled oscillator.

In IC circuits, it is usual that fluctuations are unavoidable in characteristics of elements in each IC circuit. The oscillation frequency range therefore differ from one phase locking loop IC circuit to another. As a consequence, it has been the practice to provide an adjusting terminal in the phase locking loop IC circuit to adjust the oscillation frequency range and a pull-in range on placing the phase locking loop IC circuit in a whole IC package.

Adjustment of the oscillation range is a superfluous step on completing the phase locking loop IC circuit. This results in a rise of cost of manufacture and in an undesirable increase of time in manufacturing a phase locking loop circuit.

SUMMARY OF THE INVENTION

It is consequently an object of the present invention to provide a phase locking method of phase locking an output signal to an input signal, which method need not adjust a frequency range before practical use.

It is another object of this invention to provide a phase locking method which is of the type described and in which the frequency range is automatically adjusted when supplied with the input signal.

It is still another object of this invention to provide a phase locking method which is of the type described and which can be put in actual operation with a low cost.

It is still another object of this invention to provide a phase locking method which is of the type described and which can be put in actual operation without a preliminary adjustment.

It is a further object of this invention to provide a phase locking loop circuit for carrying out the phase locking method of the type described.

It is a still further object of this invention to provide a phase locking loop circuit which is of the type described and which need not have an adjusting terminal for use in adjusting the frequency range.

Different objects of this invention will become clear as the description proceeds.

In accordance with an aspect of this invention, there is provided a method of phase locking an output signal to an input signal comprising the steps of (a) comparing the input and the output signals as regards frequency and phase to produce a frequency and phase difference signal representative of a frequency and phase difference between the input and the output signals, (b) filtering the frequency and phase difference signal into a filtered signal of a voltage dependent on the frequency and phase difference, and (c) generating under control by the filtered signal a voltage controlled oscillation signal phase locked for use as the output signal to the input signal, wherein (A) the comparing step comprises a step of detecting synchronism between the input and the output signals to produce a synchronism indication signal indicative of whether or not the output signal has a constant phase difference from the input signal, (B) the method comprising an additional step of producing an oscillation control signal in response to the frequency and phase difference signal and the synchronism indication signal for use in controlling the generating step as regards an oscillation frequency range of the voltage controlled oscillation signal in accordance with the frequency and phase difference when the synchronism indication signal is continuously indicative of collapse of synchronism between the input and the output signals longer than a predetermined time interval.

In accordance with a different aspect of this invention, there is provided a phase locking loop circuit comprising (a) a frequency and phase comparator responsive to circuit input and output signals for producing a frequency and phase difference signal representative of a frequency and phase difference between the circuit input and output signals, (b) a filter for filtering the frequency and phase difference signal into a filtered signal of a voltage dependent on the frequency and phase difference, and (c) a voltage controlled oscillator controlled by the filtered signal for generating a voltage controlled oscillation signal, wherein (A) the frequency and phase comparator comprises detecting means for detecting synchronism between the circuit input and output signals to produce a synchronism indication signal indicative of whether or not the circuit output signal is in synchronism with the circuit output signal, (B) the phase locking loop circuit further comprising oscillation control means responsive to the frequency and phase difference signal and the synchronism indication signal for producing an oscillation control signal for use in controlling an oscillation frequency range of the voltage controlled oscillation signal in response to the frequency and phase difference when the synchronism indication signal is continuously indicative of collapse of synchronism between the circuit input and output signals longer than a predetermined time interval.

It is to be noted that the phase locking loop circuit of this invention is specifically suitable for implementation as an IC circuit.

DESCRIPTION OF THE PREFERRED EMBODIMENT

Figure 1:
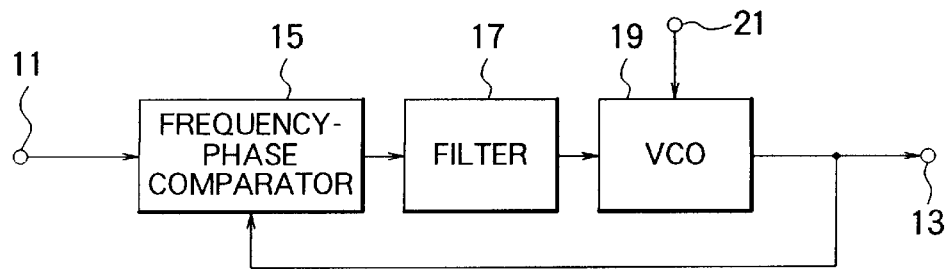
FIG. 1 is a block diagram of a conventional phase locking loop circuit.

Referring to FIG. 1, a conventional phase locking loop circuit will first be described in order to facilitate an understanding of the present invention. The phase locking loop circuit is in general for phase locking a circuit output signal to a circuit input signal.

In FIG. 1, the phase locking loop circuit has a circuit input terminal 11 and a circuit output terminal 13. When the circuit input signal is supplied to the circuit input terminal 11, the phase locking circuit delivers the circuit output signal to the circuit output terminal 13. The phase locking loop circuit is so called because of a feedback loop which is included therein and will be described in the following.

In the feedback loop, the phase locking loop circuit comprises a frequency and phase comparator 15 responsive to the circuit input signal supplied through the circuit input terminal 11 and the circuit output signal supplied through the feedback loop for producing a frequency and phase difference signal representative of a frequency and phase difference between the circuit input and output signals. Connected to the frequency and phase comparator 15 in the feedback loop, a filter 17 filters the frequency and phase difference signal into a filtered signal which has a voltage dependent on the frequency and phase difference. Connected to the filter 17 in the feedback loop, a voltage controlled oscillator (VCO) 19 generates a voltage controlled oscillation signal with an oscillation frequency controlled by the voltage of the filtered signal. While delivered to the circuit output terminal 13 as the circuit output signal, the voltage controlled signal is fed back to an input side of the frequency and phase comparator 15 through the feedback loop.

When the phase locking loop circuit is used in an IC package as a phase locking loop IC circuit, it is necessary for use in the package to control an oscillation frequency range of the voltage controlled oscillation signal and a pull-in range of the phase locking loop circuit. For this purpose, a frequency range adjusting terminal 21 is connected to the voltage controlled oscillator 19. The pull-in range is alternatively called either a capture or a seize range in the Rich tutorial paper referred to hereinabove. The pull-in range is determined by the time content of the filter 17 and the gain of the voltage controlled oscillator 19.

Figure 2:
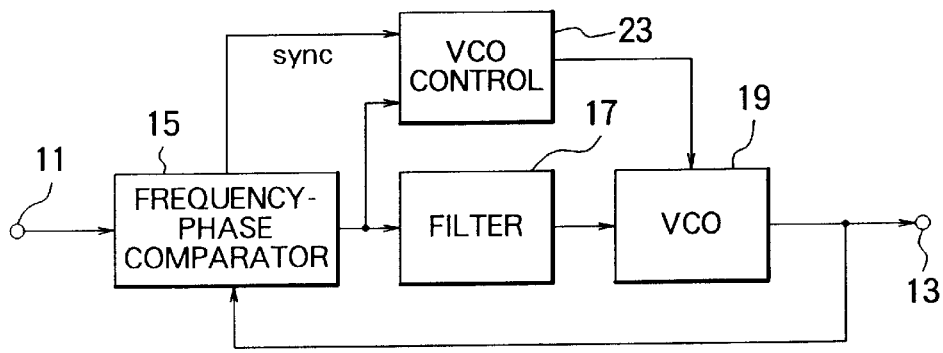
FIG. 2 is a block diagram of a phase locking loop circuit according to an embodiment of the instant invention.

Referring now to FIG. 2, the description will proceed to a phase locking loop circuit according to a preferred embodiment of this invention. Similar parts are designated by like reference numerals and are similarly operable with likewise named signals unless otherwise specifically mentioned.

In addition to production of the frequency and phase difference signal, the frequency and phase comparator 15 produces a synchronism indication signal (sync). In the manner which will presently be described more in detail, the frequency and phase comparator 15 uses the circuit input and output signals in detecting synchronism between the circuit input and output signals to produce the synchronism indication signal.

In the feedback loop, the filter 17 has a time constant which defines a feedback loop bandwidth of the feedback loop. The voltage controlled oscillator 19 comprises adjusting means for adjusting the oscillation frequency range as will shortly be described. The feedback loop has a branch in which the phase locking loop circuit comprises a VCO controller 23 responsive to the frequency and phase difference signal and the synchronism indication signal for supplying an oscillation control signal to the adjusting means of the voltage controlled oscillator 19. When the synchronism indication signal is continuously indicative of collapse of synchronism between the circuit input and output signals longer than a predetermined time interval which is not shorter than the pull-in time, the oscillation control signal adjusts the oscillation frequency range in accordance with a state of the synchronism indication signal in the manner which will later be described in greater detail. It is therefore unnecessary in FIG. 2 that the phase locking loop circuit should have the frequency range adjusting terminal 21 described in conjunction with FIG. 1.

Figure 3:
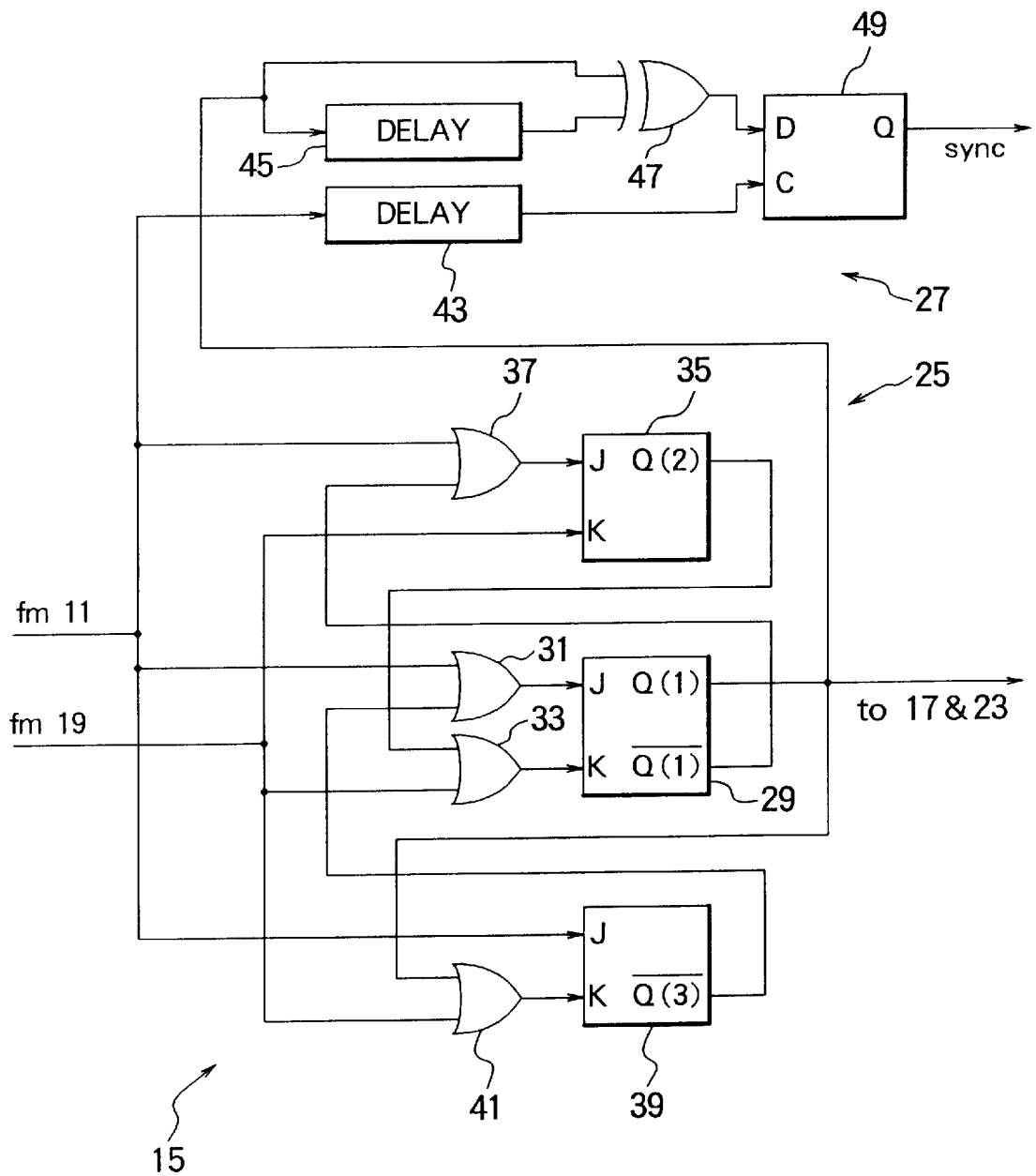
FIG. 3 is a block diagram of a frequency and phase comparator for use in the phase locking loop circuit illustrated in FIG. 2.

Turning to FIG. 3, the frequency and phase comparator 15 of FIG. 2 comprises a frequency and phase comparator part 25 and a synchronism detector part 27. From the circuit input terminal 11, the circuit input signal is delivered to the frequency and phase detector part 25. Supplied from the voltage controlled oscillator 19 additionally with the voltage controlled oscillation signal, the frequency and phase comparator part 25 supplies the filter 17 and the VCO controller 23 with the frequency and phase difference signal. Supplied with the circuit input signal and the frequency and phase difference signal, the synchronism detector part 27 delivers the synchronism indication signed to the VCO controller 23.

The frequency and phase comparator part 25 comprises a first JK flipflop 29 having a first J input terminal supplied, through a first OR gate 31, with the circuit input signal and a first additional signal which will presently be described. The first JK flipflop 29 has a first K input terminal supplied, through a second OR gate 33, with the voltage controlled oscillation signal and a second additional signal which will shortly be described. The first JK flipflop 29 produces through a first non-inverted output terminal Q(1) a principal non-inverted output signal as the frequency and phase difference signal and through a first inverted output terminal $\overline{Q(1)}$ a principal inverted output signal.

A second JK flipflop 35 has a second J input terminal supplied, through a third OR gate 37, with the circuit input signal and the principal inverted output signal. A second K input terminal is supplied directly with the voltage controlled oscillation signal. The second JK flipflop 37 produces an additional non-inverted output signal for use as the second additional input signal.

A third JK flipflop 39 has a third J input terminal supplied with the circuit input signal directly and a third K input terminal supplied, through a fourth OR gate 41, with the voltage controlled oscillation signal and the principal non-inverted output signal. The third JK flipflop 39 produces an additional inverted signal for use as the first additional input signal.

The synchronism detector part 27 comprises a first delay circuit 43 for giving a first delay to the circuit input signal to produce a first delayed signal. A second delay circuit 45 gives the frequency and phase difference signal a second delay which is longer than the first delay. The second delay circuit 45 produces a second delayed signal. Responsive to frequency and phase difference signal and the second delayed signals, an exclusive OR gate 47 produces an exclusive OR signal. A D-type flipflop is used as a latch circuit 49 for latching the exclusive OR signal by using the first delayed signal as a latch timing clock signal. The latch circuit 49 produces a latched signal as the synchronism indication signal.

In the manner which will again be described in greater detail, it will be assumed that the phase locking loop circuit is in a steady state of operation where the voltage controlled signal has an input frequency of the circuit input signal. In this event, a pulse of the circuit input signal is always followed by a pulse of the voltage controlled signal. Responsive to the pulse of the circuit input signal, the frequency and phase difference signal is given a high level, namely, logic one. When the pulse of the voltage controlled oscillation signal appears, the high level is switched to a low level, namely, logic zero.

It will next be assumed that the voltage controlled oscillation signal has a lower frequency lower than the circuit input signal. In this event, two pulses of the circuit input signal may successively appear between two consecutive pulses of the voltage controlled oscillation signal. In the meantime, the frequency and phase difference signal is kept at the low level.

It will now be assumed that the voltage controlled oscillation signal has a higher frequency than the circuit input signal. In this event, two pulses of the voltage controlled oscillation signal may consecutively appear between the successive pulses of the circuit input signal. This makes the frequency and phase difference signal meanwhile have the high level.

In this manner, the frequency and phase difference signal has a one and a zero interval which are variable dependent on a phase difference between the circuit input signal and the voltage controlled oscillation signal. It is therefore possible with the synchronism detector part 27 to produce the synchronism indication signal.

Figure 4:
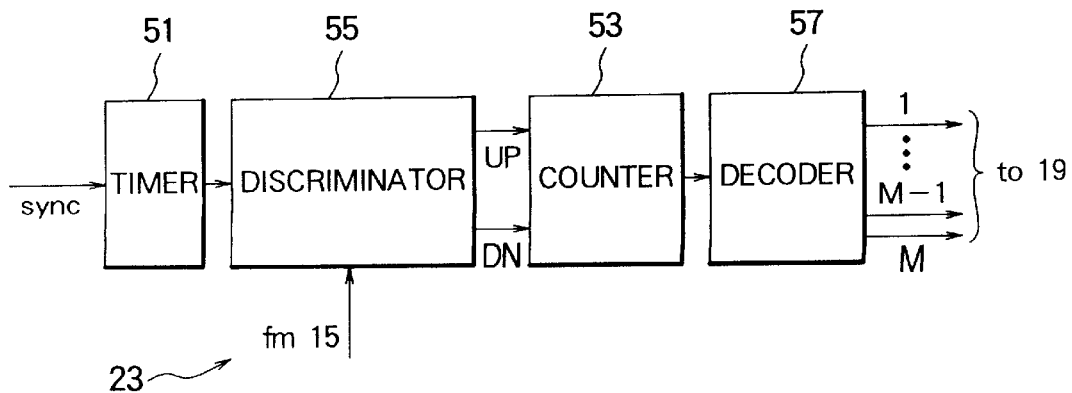
FIG. 4 is a block diagram of an example of an oscillation frequency range controller for use in the phase locking loop circuit depicted in FIG. 2.

Referring to FIG. 4, an example of the VCO controller 23 comprises a timer 51 responsive to the synchronism indication signal for timing the predetermined time interval from occurrence of the collapse of synchronism between the circuit input signal and the voltage controlled oscillation signal or the circuit output signal to produce a timing signal upon lapse of the predetermined time interval. The timer 51 is, for example, a one-shot pulse generator triggered by build up of the timing signal and cleared when the synchronism indication signal recovers from indication of the collapse of synchronism. In the manner which will soon be described, a controllable or up-down counter 53 is for counting a count and produces a count signal representative of the count.

Between the timer 51 and the controllable counter 53, a discriminator 55 is interposed and is responsive to the timing signal to discriminate the frequency and phase difference signal supplied from the frequency and phase comparator 15 as regards whether the voltage controlled signal has the higher or the lower frequency than the circuit input signal continuously in the meantime. When the voltage controlled oscillation signal has the higher and the lower frequencies, the discriminator supplies the controllable counter 53 with count up (UP) and down (DN) signals, one at a time, respectively.

Connected to the controllable counter 53, a decoder 57 decodes the count signal into first to M-th adjusting signals which are collectively referred to as the oscillation control signal and are supplied to the voltage controlled oscillator 19 to widen or narrow the oscillation frequency range as will later be described, where M represents an integer which will presently become it clear.

Figure 5:
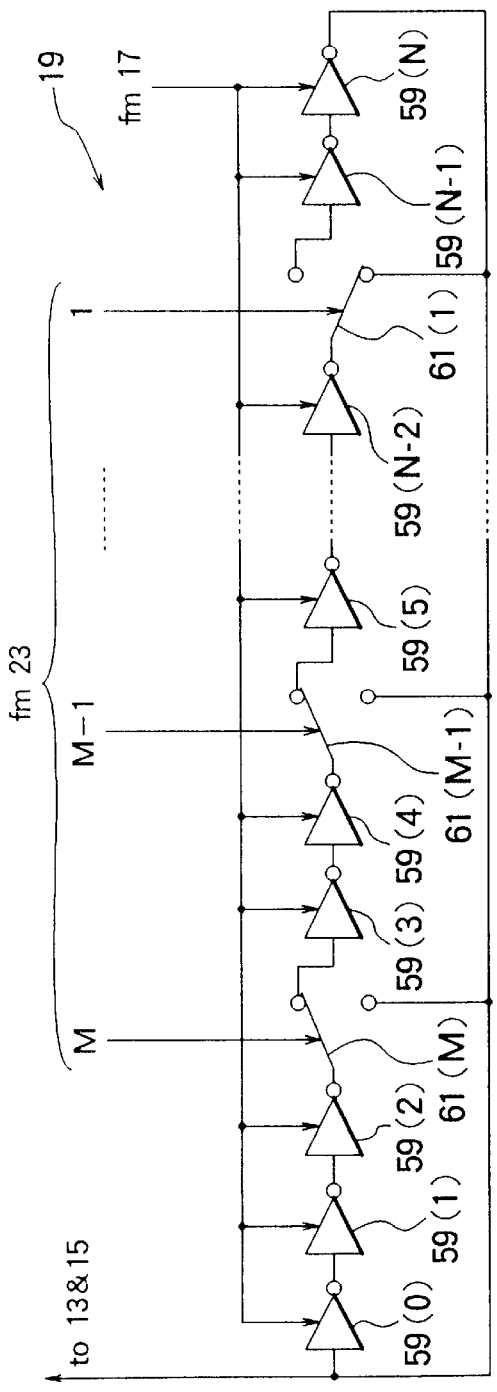
FIG. 5 is a block diagram of a voltage controlled oscillator for use in the phase locking loop circuit illustrated in FIG. 2.

Referring to FIG. 5, the voltage controlled oscillator 19 generates the voltage controlled oscillation signal with a voltage controlled oscillation frequency which is controlled by the voltage of the filtered signal supplied from the filter 17. It should be noted that this voltage controlled oscillation signal is generated in the oscillation frequency range which is controlled by the oscillation control signal supplied from the VCO controller 23 rather than by a range adjusting signal supplied from the frequency range adjusting terminal 21 described in conjunction with FIG. 1.

More particularly, the voltage controlled oscillator 19 comprises a ring oscillator composed of zeroth and first to N-th inverters 59(0), 59(1), 59(2), 59(3), 59(4), 59(5), . . . , 59(N−2), 59(N−1), and 59(N) which are connected as an inverter loop to cyclically invert a circulating signal to produce zeroth and first to N-th inverted signals, respectively, where N represents an odd integer predetermined in consideration primarily of the oscillation frequency range. These zeroth through the N-th inverters will be collectively designated by a single reference numeral 59. An n-th inverter will be denoted by 59(n), where n represents one of 0 to N. In order to make the circulating signal have the voltage controlled oscillation frequency, each of the zeroth to the N-th inverters 59 is given an inverter delay adjusted by the filtered signal.

In order to make the voltage controlled oscillator 19 generate the voltage controlled oscillation signal in a controllable oscillation frequency range, the zeroth to the N-th inverters 59 are grouped into a plurality of inverter groups. One of the inverter groups includes the zeroth inverter 59(0) and two immediately following inverters, namely, the first and the second inverters 59(1) and 59(2). Each of other inverter groups consists of an even number of the third to the N-th inverters 59(3) to 59(N). In the example being illustrated, a first inverter group consists of the N-th and the (N−1)-th inverters 59(N) and 59(N−1). In this manner, a second inverter group includes the (N−2)-th inverter 59(N−2), an (M−1)-th inverter group including the fifth inverter 59(5), an M-th inverter group consisting of the fourth and the third inverters 59(4) and 59(3).

A first switch 61(1) is interposed between an input side of the first inverter group and an output side of the second inverter group. In a similar manner, an (M−1)-th switch 61(M−1) is interposed between an input side of the (M−1)-th inverter group and an output side of the M-th inverter group with an M-th switch 61(M) interposed between an input side of the M-th inverter group, namely, an input side of the third inverter 59(3), and an output side of the second inverter 59(2).

The first to the M-th switches 61(1) to 61(M) will collectively be designated by a single reference numeral 61. An m-th switch will be denoted by 61(m), where m is one of 1 to M. The first to the M-th switches 61 are controlled by the first to the M-th adjusting signals supplied from the decoder 57 of the VCO controller 23, respectively. At a time when the m-th switch 61(m) (not shown) is closed, the first switch 61(1) to an (m−1)-th switch are open with an (m+1)-th switch to the M-th switch 61(M) all closed. Consequently, the circulating signal is cyclically inverted by the zeroth to the second inverters 59(0) to 59(2) and by the inverters of the M-th inverter group down to the inverters of an m-th inverter group, these inverters 59(0) and so forth forming a shorter inverter group.

It is now understood in connection with the voltage controlled oscillator 19 being illustrated that the VCO controller 23 produces the first to the M-th adjusting signals collectively as the oscillation control signal to control the first to the M-th switches 61, respectively, so as to switch a loop length of the inverter loop of the zeroth to the N-th inverters 59 to an adjustable length. More specifically, the zeroth inverter 59(0) is supplied with a (2n'+1)-th inverted signal, such as one of the zeroth to the N-th inverted signal that is produced by an inverter having its output side connected to the m-th switch 61(m), where n' represents one of 3 to N that is selected by the oscillation control signal so that (2n'+1) is not greater than N. The first to the M-th switches 61 may be closed and left open when corresponding ones of the first to the M-th adjusting signals have high and low levels, respectively.

Figure 6:
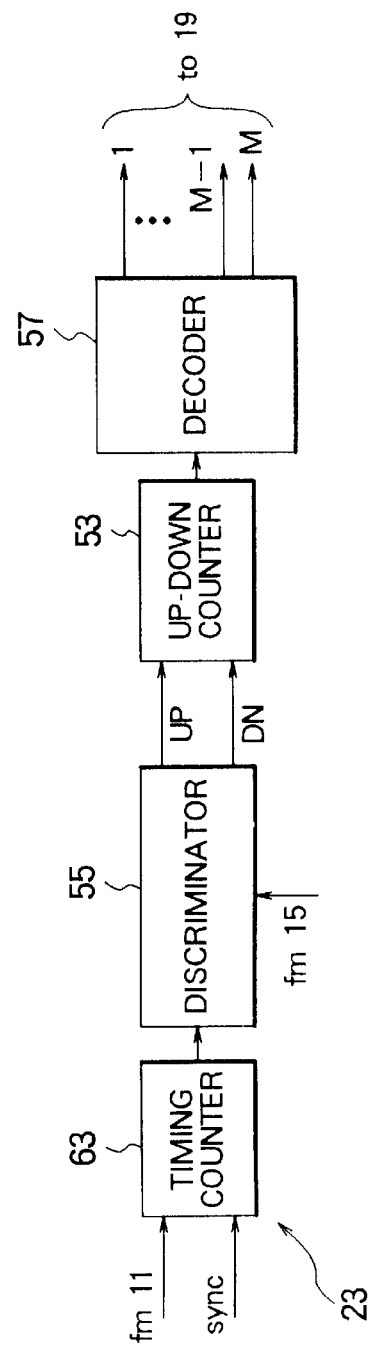
FIG. 6 is a block diagram of another example of an oscillation frequency range controller for use in the phase locking loop circuit depicted in FIG. 2.

Turning to FIG. 6, attention may be directed here to another example of the VCO controller 23, which is further responsive to pulses of the circuit input signal supplied from the circuit input terminal 11. When the synchronism indication signal indicates occurrence of collapse of the synchronism between the circuit input signal and the voltage controlled oscillation signal or the circuit output signal, a timing counter 63 begins to count a count of the pulses of the circuit input signal and produces, upon lapse of the predetermined time interval, the timing signal mentioned in the foregoing. In FIG. 6, the VCO controller 23 is similar in other respects to that described above, except for use of the timing counter 63 instead of the timer 51 described in conjunction with FIG. 4. This VCO controller 23 is more excellent than that illustrated with reference to FIG. 4 because the timing counter 63 is capable of producing the timing signal more correctly upon lapse of the predetermined time interval from a time instant at which the synchronism indication signal indicates occurrence of the collapse as by turning to the low level.

Figure 7A:
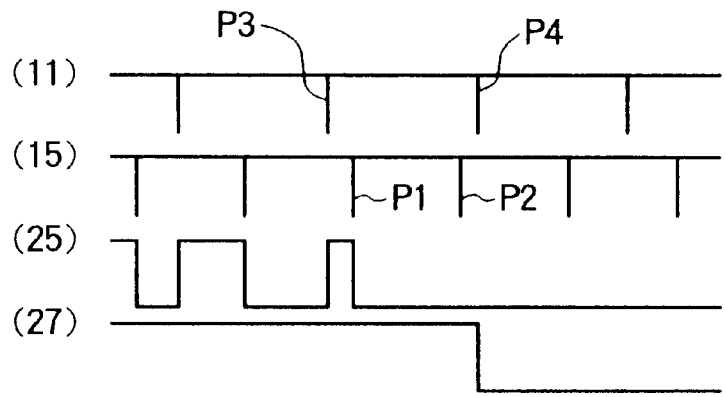
FIG. 7 shows waveforms for use in describing operation of the frequency and phase comparator illustrated in FIG. 3.
Figure 7B:
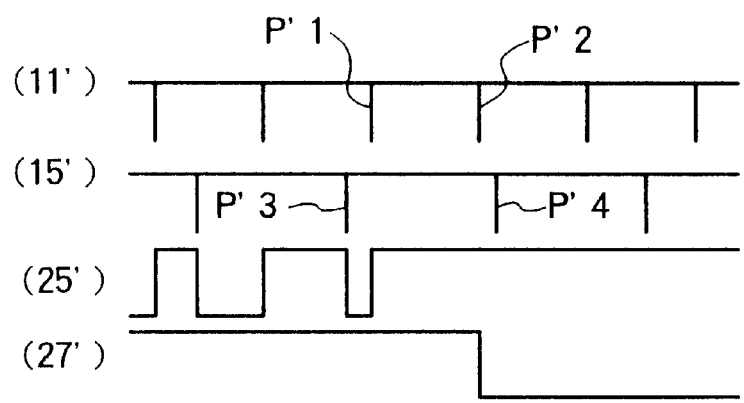
Figure 7C:
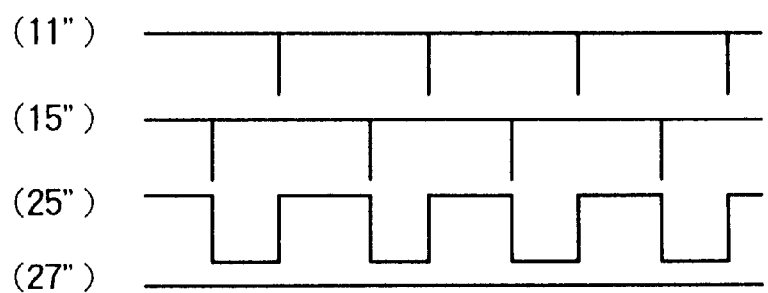

Referring now to FIG. 7, operation will be described more in detail as regards the frequency and phase comparator 15 described with reference to FIGS. 2 and 3. It will first be presumed that the voltage controlled oscillation signal has a higher frequency than the circuit input signal. The pulses of the circuit input signal appear at predetermined time instants in the manner exemplified along a top or first row indicated by using the reference numeral of the circuit input terminal as a legend (11). In the voltage controlled oscillation signal, pulses appear as exemplified along a second row indicated by using the reference numeral of the voltage controlled oscillator as another legend (15). Under the circumstances, the frequency and phase comparator part 25 produces the frequency and phase difference signal with logic one and zero levels in the manner indicated by high and low levels along a third row indicated by still another legend (25). The synchronism detector part 27 produces the synchronism indication signal as illustrated along a fourth row indicated by yet another legend (27).

Inasmuch as two consecutive pulses P1 and P2 appear in the voltage controlled oscillation signal (15) within a certain time interval defined by two consecutive pulses P3 and P4 of the circuit input signal (11), the frequency and phase difference signal (25) is kept at the logic zero after appearance of the pulse P1 in the voltage controlled oscillation signal (15). When the pulse P4 appears in the circuit input signal (11) while the frequency and phase difference signal is the logic zero, the synchronism indication signal (27) is switched from the logic one to the logic zero and thereafter kept at the logic zero. Switch of the synchronism indication signal from the logic one to the logic zero indicates occurrence of the collapse of synchronism.

It will next be surmised that the voltage controlled oscillation signal has a lower frequency than the circuit input signal. Although identical with the pulses depicted along the top row (11), the pulses of the circuit input signal are illustrated along a fifth row. Including the fifth row, sixth to eighth rows show waveforms of the signals depicted above and are identified by legends with a prime added as (11'), (15'), (25'), and (27') to the legends used for the first to the fourth rows.

In the circuit input signal (11'), two pulses P'1 and P'2 consecutively appear within a time interval defined by two consecutive pulses P'3 and P'4 of the voltage controlled oscillation signal (15'). When the pulse P'1 appears in the circuit input signal (11'), the frequency and phase difference signal (25') is thereafter kept at the logic one. When the pulse P'2 meanwhile appears in the circuit input signal (11'), the synchronism indication signal (27') is switched from the logic one into the logic zero to indicate occurrence of the collapse of synchronism.

It will now be surmised that the voltage controlled oscillation signal has the frequency of the circuit input signal. Signal waveforms are depicted along ninth row to twelfth or bottom row which are indicated by legends (11"), (15"), (25"), and (27") with double primes. Under the circumstances, the pulses of the circuit input signal (11") and the pulses of the voltage controlled oscillation signal (15") alternatively appear in a staggered fashion. The frequency and phase difference signal (25") builds up from the logic zero to the logic one, whenever the pulses appear in the circuit input signal (11"), and builds down from the logic one to the logic zero at appearances of the pulses in the voltage controlled oscillation signal (15"). The synchronism indication signal (27") is kept at the logic one level to indicate that the voltage controlled oscillation signal (15") is kept in synchronism with the circuit input signal (11").

Figure 8:
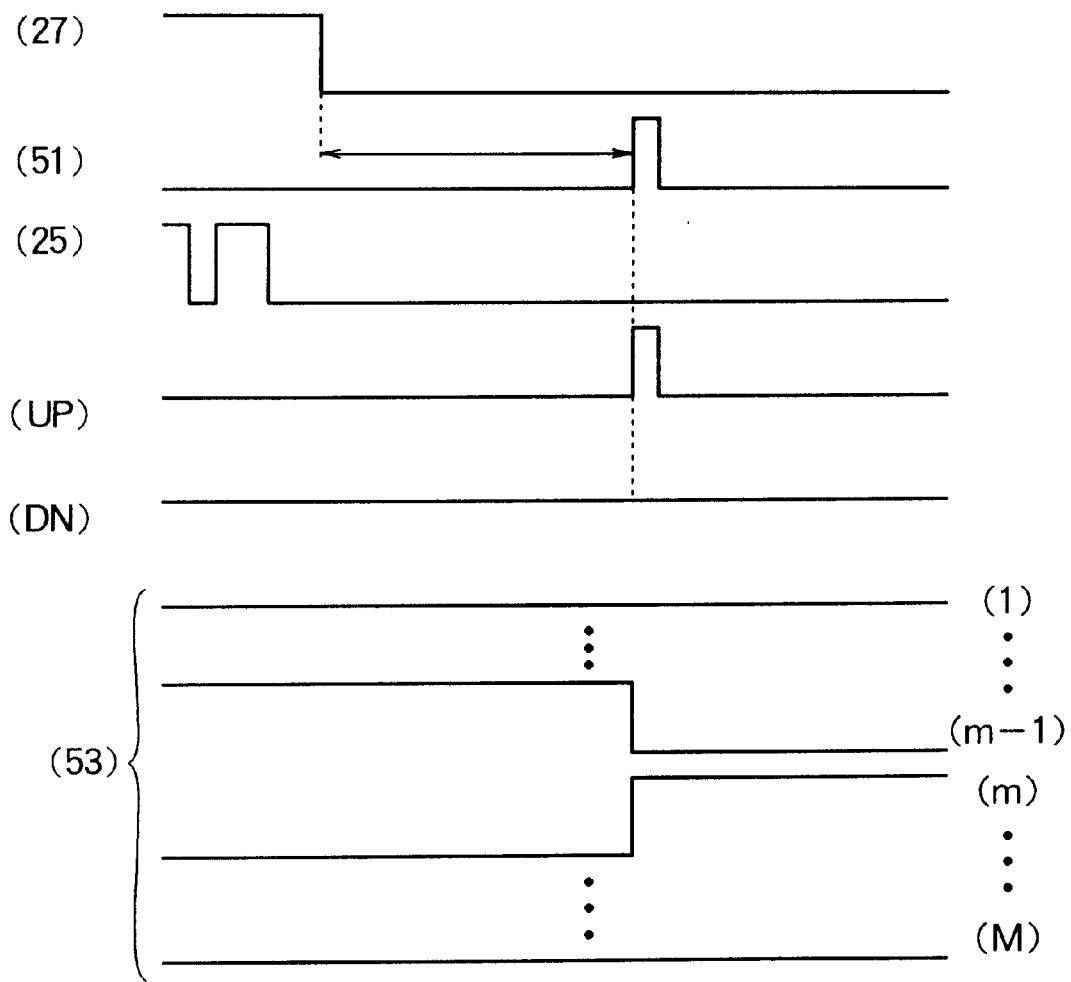
FIG. 8 shows waveforms for use in describing operation of the oscillation frequency range controller depicted in FIG. 4.

Turning to FIG. 8, operation of the VCO controller 23 will be described in detail, using FIG. 4 in addition. It will be presumed that the voltage controlled oscillator 19 of FIG. 2 produces the voltage controlled oscillation signal which goes out of synchronism at a certain time instant by the synchronism indication signal exemplified along a first or top row indicated by the legend (27) as before.

Responsive to this occurrence of the collapse of synchronism, the timer 51 produces the timing signal as a pulse illustrated along a second row indicated by a legend (51). Between the first and the second rows (27) and (51), a horizontal solid line with arrowheads on both ends shows the predetermined time interval. The discriminator 55 is supplied from the frequency and phase comparator part 25 of the VCO controller 23 with the synchronism indication signal exemplified along a third row indicated by the legend (25) used before. Before occurrence of the collapse, the synchronism indication signal (25) is already switched from the logic one to the logic zero in the manner described in conjunction with FIG. 7 along the third row (25). In this event, the discriminator 55 produces the count up signal as depicted along a fourth row indicated by another legend (UP). No count down signal is produced as depicted along a fifth row indicated by still another legend (DN).

The decoder produces the first to the M-th adjusting signals in the manner exemplified along sixth and subsequent rows which are collectively called bottom rows and indicated by still another legend (57). Among the bottom rows, a first or top one shows the first adjusting signal indicated on the right side by a sublegend (1). A second one shows an (m−1)-th adjusting signal (m−1). A third one shows the m-th adjusting signal (m). A fourth or ultimate one shows the M-th adjusting signal (M). When the controllable counter 53 is counted up as above, the m-th adjusting signal builds up from a logic zero to a logic one. At this time instant, the decoder 57 switches the (m−1)-th adjusting signal from the logic one to the logic zero. In this manner, the first adjusting signal is kept in the logic zero while the M-th adjusting signal is held at the logic one.

If the timer 51 produces the pulse of the timing signal (51) while the frequency and phase difference signal of the frequency and phase difference comparator part 25 of the VCO controller 23 is kept at the logic one in the manner illustrated in FIG. 7 along the seventh row (25'), the discriminator 55 produces the count down signal (DN) rather than the count up signal (UP). In response, the controllable counter 53 counts down the count. In compliance with the count at which the count signal reaches, the decoder 57 changes the m-th adjusting signal from the logic zero to the logic one, keeping the first to the (m−1)-th adjusting signals at the logic zero and the (m+1)-th to the M-th adjusting signals at the logic one, provided that (m+1) is equal to or less than M.

While this invention has thus far been described in conjunction with the best mode thereof together with two examples of the VCO controller 23, it will now be readily possible for one skilled in the art to carry this invention into effect in various other manners. Above all, it is possible to use the logic one and zero in a different way.

What is claimed is:

1. A method of phase locking an output signal to an input signal comprising the steps of comparing said input and said output signals as regards frequency and phase to produce a frequency and phase difference signal representative of a frequency and phase difference between said input and said output signals, filtering said frequency and phase difference signal into a filtered signal of a voltage dependent on said frequency and phase difference, and generating under control of said filtered signal a voltage controlled oscillation signal phase locked for use as said output signal to said input signal, wherein:

said comparing step comprises a step of detecting synchronism between said input and said output signals to produce a synchronism indication signal indicative of whether or not said input signal has a constant phase difference from said output signal;

said method comprising an additional step of producing an oscillation control signal in response to said frequency and phase difference signal and said synchronism indication signal for use in controlling said generating step as regards an oscillation frequency range of said voltage controlled oscillation signal in accordance with said frequency and phase difference when said synchronism indication signal is continuously indicative of collapse of synchronism between said input and said output signals longer than a predetermined time interval.

2. A method as claimed in claim 1, wherein said detecting step uses said frequency and phase difference signal in place of said output signal and comprises the steps of:

giving a first delay to said input signal to produce a first delayed signal;

giving said frequency and phase difference signal a second delay longer than said first delay to produce a second delayed signal;

calculating an exclusive OR of said frequency and phase difference signal and said second delayed signals to produce an exclusive OR signal; and latching said exclusive OR signal by using said first delayed signal as a latch timing clock signal to produce a latched signal as said synchronism indication signal.

3. A method as claimed in claim 1, wherein said generating step comprises the steps of:

cyclically inverting a circulating signal an odd number of times as successively inverted signals with each of said successively inverted signal given a delay varied in accordance with said filtered signal; and adjusting said odd number of times in accordance with said oscillation control signal to use said circulating signal as said voltage controlled oscillation signal.

4. A method as claimed in claim 3, wherein:

said cyclically inverting step inverts said circulating signal at a zeroth to an N-th stage to produce said successively inverted signals as a first to a zeroth inverted signal through an N-th inverted signal, respectively, where N represents a predetermined odd integer;

said adjusting step supplying a (2n+1)-th inverted signal to said cyclically inverting step instead of said N-th inverted signal, with a (2n+1)-th time selected in accordance with said oscillation control signal, where (2n+1) is not greater than N.

5. A method as claimed in claim 1, wherein said additional step comprises the steps of:

timing responsive to said synchronism indication signal said predetermined time interval from occurrence of said collapse to produce a timing signal upon lapse of said predetermined time interval;

controllably counting a count to produce a count signal representative of said count;

discriminating responsive to production of said timing signal said frequency and phase difference signal as regards whether said count should be counted up or down; and decoding said count signal into said oscillation control signal to widen and narrow said oscillation frequency range when said count is counted up and down, respectively.

6. A method as claimed in claim 5, wherein said timing step is to count pulses of said input signal to produce said timing signal when the count of said pulses reaches a predetermined count.

7. A phase locking loop circuit comprising a frequency and phase comparator responsive to circuit input and output signals for producing a frequency and phase difference signal representative of a frequency and phase difference between said circuit input and output signals, a filter for filtering said frequency and phase difference signal into a filtered signal of a voltage dependent on said frequency and phase difference, and a voltage controlled oscillator controlled by said filtered signal for generating a voltage controlled oscillation signal phase locked for use as said circuit output signal to said circuit input signal, wherein:

said frequency and phase comparator comprises detecting means for detecting synchronism between said circuit input and output signals to produce a synchronism indication signal indicative of whether or not said circuit output signal is in synchronism with said circuit input signal;

said phase locking loop circuit further comprising oscillator control means responsive to said frequency and phase difference signal and said synchronism indication signal for producing an oscillation control signal for use in controlling an oscillation frequency range of said voltage controlled oscillation signal in response to said frequency and phase difference when said synchronism indication signal is continuously indicative of collapse of synchronism between said circuit input and output signals longer than a predetermined time interval.

8. A phase locking loop circuit as claimed in claim 7, wherein said predetermined time interval is not shorter than a pull-in time predetermined for said phase locking loop circuit.

9. A phase locking loop circuit as claimed in claim 7, said frequency and phase comparator comprising comparing means for comparing said circuit input and output signals as regards frequency and phase to produce said frequency and phase difference signal, wherein said detecting means detects said synchronism in response to said circuit input signal and said frequency and phase difference signal.

10. A phase locking loop circuit as claimed in claim 9, wherein said detecting means comprises:

a first delay circuit for giving a first delay to said circuit input signal to produce a first delayed signal;

a second delay circuit for giving said frequency and phase difference signal a second delay longer than said first delay to produce a second delayed signal;

an exclusive OR gate for calculating an exclusive OR of said frequency and phase difference signal and said second delayed signal to produce an exclusive OR signal; and a latch circuit for latching said exclusive OR signal by using said first delayed signal as a latch timing clock signal to produce a latched signal as said synchronism indication signal.

11. A phase locking loop circuit as claimed in claim 9, wherein said frequency and phase comparing means comprises:

a first JK flipflop having a first J input terminal supplied with said circuit input signal and a first additional input signal through a first OR gate and a first K input terminal supplied with said circuit output signal and a second additional input signal through a second OR gate to produce a principal non-inverted output signal as said frequency and phase difference signal and a principal inverted output signal;

a second JK flipflop having a second J input terminal supplied with said circuit input signal and said principal inverted signal through a third OR gate and a second K input terminal supplied with said circuit output signal directly to produce an additional non-inverted output signal for use as said second additional input signal; and a third JK flipflop having a third J input terminal supplied with said circuit input signal directly and a third K input terminal supplied with said circuit output signal and said principal non-inverted signal through a fourth OR gate to produce an additional inverted signal as said first additional input signal.

12. A phase locking loop circuit as claimed in claim 7, wherein said voltage controlled oscillator generates said voltage controlled oscillation signal with a voltage controlled oscillation frequency controlled by the voltage of said filtered signal in the oscillation frequency range controlled by said oscillation control signal.

13. A phase locking loop circuit as claimed in claim 12, wherein said voltage controlled oscillator comprises:

zeroth and first to N-th inverters connected as an inverter loop to cyclically invert a circulating signal to produce zeroth and first to N-th inverted signals, respectively, with each of said zeroth and sad first to said N-th inverted signals given an inverter delay adjusted by said filtered signal, where N represents a predetermined odd integer; and switching means for switching a loop length of said inverter loop by said oscillation control signal to supply a (2n+1)-th inverted signal to said zeroth inverter instead of a next following one of said first to said N-th inverters and to make a (2n+1)-th inverter produce said (2n+1)-th inverted signal as said voltage controlled oscillation signal, where n represents one of 1 to N that is selected by said oscillation control signal so that (2n+1) is not greater than N.

14. A phase locking loop circuit as claimed in claim 13, wherein said switching means comprises a switch responsive to said oscillation control signal for switching an output side of said (2n+1)-th inverter to an input side of said zeroth inverter to make said (2n+1)-th inverter produce said voltage controlled oscillation signal.

15. A phase locking loop circuit as claimed in claim 7, wherein said oscillation control means comprises:

timing means responsive to said synchronism indication signal for timing said predetermined time interval from occurrence of said collapse to produce a timing signal upon lapse of said predetermined time interval;

a controllable counter for counting a count to produce a count signal representative of said count;

a discriminator responsive to production of said timing signal for discriminating said frequency and phase difference signal as regards whether said counter should count up or down said count; and a decoder for decoding said count signal into said oscillation control signal to widen and narrow said oscillation frequency range when said count is counted up and down, respectively.

16. A phase locking loop circuit as claimed in claim 15, wherein said timing means comprises a timer responsive to said synchronism indication signal for timing said predetermined time interval from occurrence of said collapse to produce said timing signal upon lapse of said predetermined time interval.

17. A phase locking loop circuit as claimed in claim 15, wherein said timing means is further responsive to pulses of said circuit input signal and comprises a counter responsive to said synchronism indication signal for counting said pulses of the circuit input signal from occurrence of said collapse to produce said timing signal upon lapse of said predetermined time interval.

18. A phase locking loop circuit as claimed in claim 7, wherein said filter generates said filtered signal to define a feedback loop time constant of a feedback loop which is used in feedback of said circuit output signal for supply to said frequency and phase comparator.

\* \* \* \* \*